United States Patent
Wakimoto (12) United States Patent (10) Patent No.: US 11,264,462 B2
Wakimoto (45) Date of Patent: Mar. 1, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Setsuko Wakimoto, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/001,087

(22) Filed: Aug. 24, 2020

(65) Prior Publication Data
US 2021/0111250 A1    Apr. 15, 2021

(30) Foreign Application Priority Data
Oct. 11, 2019 (JP) .............................. JP2019-188165

(51) Int. Cl.
| H01L 29/16 | (2006.01) |
| H01L 29/66 | (2006.01) |
| H01L 29/78 | (2006.01) |
| H01L 29/49 | (2006.01) |

(52) U.S. Cl.
CPC .... *H01L 29/1608* (2013.01); *H01L 29/66734* (2013.01); *H01L 29/7813* (2013.01); *H01L 29/4916* (2013.01)

(58) Field of Classification Search
CPC .......... H01L 29/1608; H01L 29/66734; H01L 29/7813; H01L 29/4916
USPC ......................................................... 257/288
See application file for complete search history.

(56) References Cited

U.S. PATENT DOCUMENTS

| 5,508,534 | A | * | 4/1996 | Nakamura | ............ | H01L 29/749 |
| | | | | | | 257/135 |
| 2010/0291767 | A1 | | 11/2010 | Miura | | |
| 2017/0018615 | A1 | | 1/2017 | Harada et al. | | |
| 2018/0286974 | A1 | | 10/2018 | Kumazawa et al. | | |

(Continued)

FOREIGN PATENT DOCUMENTS

| JP | H07-235676 A | 9/1995 |
| JP | 2010-267899 A | 11/2010 |

(Continued)

*Primary Examiner* — Igwe U Anya
(74) *Attorney, Agent, or Firm* — Rabin & Berdo, P.C.

(57) ABSTRACT

A silicon carbide semiconductor device, including a semiconductor substrate having first and second semiconductor regions and a plurality of third semiconductor regions sequentially formed therein, a plurality of trenches penetrating the second and third semiconductor regions, a plurality of gate electrodes provided in the trenches via a gate insulating film, an interlayer insulating film covering the gate electrodes, a plurality of contact holes penetrating the interlayer insulating film, a first electrode provided in the contact holes and at the surface of the interlayer insulating film, and a second electrode electrically connected to the first semiconductor region. The interlayer insulating film has a plurality of recessed parts and protruding parts, to thereby form at least three recesses and protrusions repeatedly at a surface of the interlayer insulating film. The first electrode includes first to third electrode films, the second electrode film having a shape reflecting the surface of the interlayer insulating film.

17 Claims, 6 Drawing Sheets

(56) References Cited

U.S. PATENT DOCUMENTS

| | | | | |
|---|---|---|---|---|
| 2018/0308972 A1* | 10/2018 | Ohse | ................... | H01L 29/1095 |
| 2018/0350976 A1* | 12/2018 | Okumura | ............ | H01L 29/1079 |
| 2020/0091299 A1* | 3/2020 | Nakamata | ............... | H01L 29/45 |

FOREIGN PATENT DOCUMENTS

| | | |
|---|---|---|
| JP | 2010-272676 A | 12/2010 |
| JP | 6475142 B2 | 2/2019 |
| WO | 2016/039074 A1 | 3/2016 |

\* cited by examiner

FIG.11
RELATED ART

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-188165, filed on Oct. 11, 2019, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

In a trench gate type metal oxide semiconductor field effect transistor (MOSFET) having a 3-layer structure including a metal, an oxide film, and a semiconductor, while a higher voltage density and a smaller chip size become possible as trench pitch is reduced, recesses and protrusions are formed by a top of an interlayer insulating film and parts of a front surface of a semiconductor substrate exposed in contact holes and therefore, step coverage of a metal electrode layer (hereinafter, Al metal electrode layer) that includes aluminum (Al) at an uppermost layer degrades.

Conventionally, in a trench gate type MOSFET that uses silicon (Si) as a semiconductor material, to flatten the Al metal electrode layer, typically, after the contact holes are formed, the recesses and the protrusions formed by the top of the interlayer insulating film and the parts of the front surface of the semiconductor substrate exposed in the contact holes are made smaller by softening and deforming the interlayer insulating film to curve the top of the interlayer insulating film so as to protrude in a direction away from the semiconductor substrate. Even when silicon carbide (SiC) is used as a semiconductor material, similar to a case in which silicon is used as a semiconductor material, the top of the interlayer insulating film is curved to smooth the Al metal electrode layer (for example, refer to Japanese Patent No. 6475142).

Figure 10:
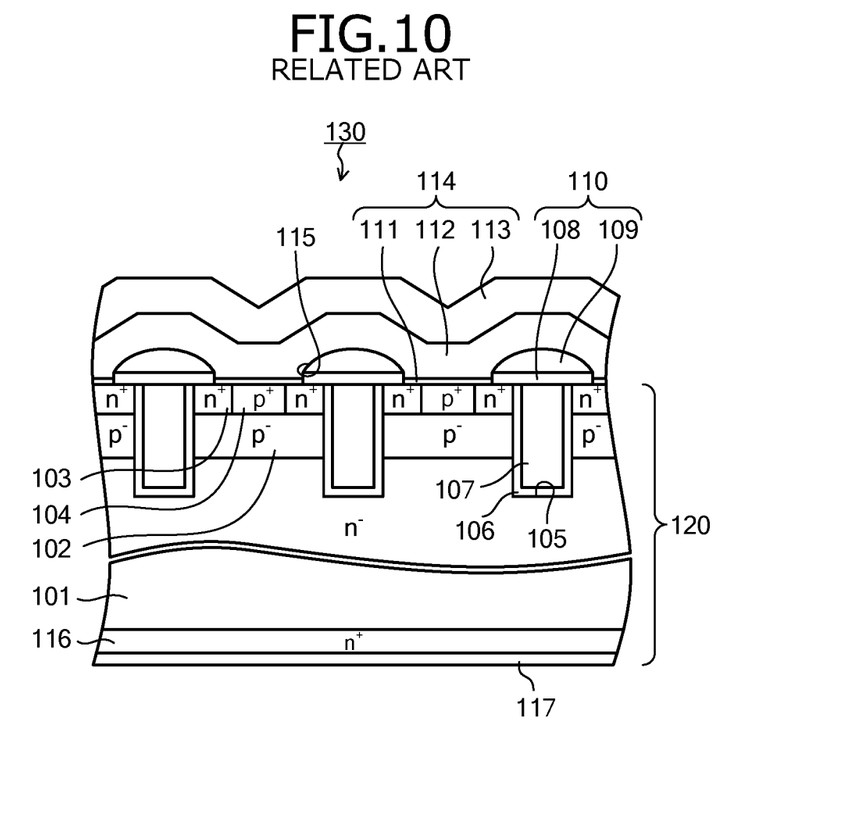
FIG. 10 is a cross-sectional view of a structure of a conventional silicon carbide semiconductor device.

A structure of a conventional trench gate type MOSFET will be described. FIG. 10 is a cross-sectional view of a structure of a conventional silicon carbide semiconductor device. FIG. 10 is FIG. 1 of Japanese Patent No. 6475142. A conventional silicon carbide semiconductor device 130 depicted in FIG. 10 is a vertical MOSFET that includes general trench gates at a front side of a semiconductor substrate 120 containing silicon carbide; and a top of an interlayer insulating film 110 covering the gate electrodes 107 is a curved surface protruding in a direction away from the semiconductor substrate 120. The interlayer insulating film 110 is a 2-layer structure in which first and second insulation layers 108, 109 are sequentially stacked on a front surface of the semiconductor substrate 120; the interlayer insulating film covers the gate electrodes 107.

The first insulating layer 108 is a non-doped silicate glass (NSG) film. The first insulating layer 108 has a top that is flat. The second insulating layer 109 is a boron phosphosilicate glass (BPSG) film. The second insulating layer 109 has a thickness that is thicker at a center of each trench 105 and thinner with increasing proximity to contact holes 115. The top of the second insulating layer 109 is a curved surface that protrudes in a direction away from the semiconductor substrate 120. By forming the top of the second insulating layer 109 to be a curved surface, the recesses and the protrusions formed by the top of the interlayer insulating film 110 and the parts of the front surface of the semiconductor substrate 120 exposed in the contact holes 115 become smaller.

As a result, respective surfaces of metal electrode layers 112, 113 that are sequentially stacked on the interlayer insulating film 110 are also smoothed. Reference numerals 111, 112, and 113 represent parts that configure a source electrode 114. Reference numeral 112 represents a stacked film in which a titanium (Ti) film and an aluminum-silicon (AlSi) film are stacked. Reference numeral 113 represents stacked film in which a nickel (Ni) plated film and a gold (Au) plated film are stacked. Reference numerals 101, 102, 103, 104, 105, 106, 107, 116, and 117 are an n$^-$-type drift region, p-type base regions, n$^+$-type source regions, p$^+$-type contact regions, trenches, a gate insulating film, gate electrodes, an n$^+$-type drain region, and a drain electrode, respectively.

In the MOSFET having silicon carbide as a semiconductor material (hereinafter, SiC-MOSFET), to form an ohmic contact between the source electrode 114 and the semiconductor substrate 120, at a lowermost layer of the source electrode 114, a nickel silicide (NiSi) film 111 is necessary. The nickel silicide film 111 is in ohmic contact with parts of the front surface of the semiconductor substrate 120 exposed in the contact holes 115. On the nickel silicide film 111, a Ti film, or a TiN film, or a metal stacked film combining both is necessary as a barrier metal that prevents diffusion of aluminum atoms from the metal electrode layer 112 containing Al to the semiconductor substrate 120.

As a conventional SiC-MOSFET having a trench gate structure, a device has been proposed in which the top of the interlayer insulating film is a curved surface that protrudes in a direction away from semiconductor substrate, and a barrier metal is provided at an entire area of the front surface of the semiconductor substrate so as to cover the top of the interlayer insulating film (for example, refer to Japanese Laid-Open Patent Publication No. 2010-272676, Japanese Laid-Open Patent Publication No. 2010-267899, International Publication No. WO 2016/039074). In Japanese Laid-Open Patent Publication No. 2010-272676, Japanese Laid-Open Patent Publication No. 2010-267899, as the barrier metal, a tungsten alloy film containing titanium is provided. In International Publication No. WO 2016/039074, as the barrier metal, a single-layer titanium nitride (TiN) film or a stacked film in which a titanium (Ti) and a titanium nitride film are sequentially stacked is provided.

Further, as another conventional SiC-MOSFET having a trench gate structure, a device has been proposed in which at the top of each gate electrode, a recess that is recessed deepest toward a drain side occurs at substantially a center of the trench, and at the top of the interlayer insulating film, recessed parts that are recessed toward the drain side, reflecting the recesses of the tops of the gate electrodes, remain at substantially the centers of the trenches (for example, refer to Japanese Laid-Open Patent Publication No. H7-235676 (FIG. 28)). In Japanese Laid-Open Patent Publication No. H7-235676, parts on both sides of each recessed part of the top of the interlayer insulating film have ends that protrude in a direction away from the semiconductor substrate, forming protrusion having a sharp shape due to the recessed part, and at a top of the barrier metal as well, recesses and protrusions reflecting the recesses and the protrusions of the top of the interlayer insulating film are formed.

SUMMARY OF THE INVENTION

According to an embodiment of the invention, a silicon carbide semiconductor device includes a semiconductor substrate having first and second main surfaces opposite to each other; a first semiconductor region of a first conductivity type provided in the semiconductor substrate; a second semiconductor region of a second conductivity type provided in the semiconductor substrate, between the first main surface of the semiconductor substrate and the first semiconductor region, and in contact with the first semiconductor region; a plurality of third semiconductor regions of the first conductivity type, selectively provided in the semiconductor substrate, between the first main surface of the semiconductor substrate and the second semiconductor region, and in contact with the second semiconductor region; a plurality of trenches, each penetrating one of the plurality of third semiconductor regions and penetrating the second semiconductor region from the first main surface of the semiconductor substrate, reaching the first semiconductor region; a plurality of gate electrodes each provided in one of the plurality of trenches, via a gate insulating film; an interlayer insulating film covering each of the plurality of gate electrodes, the interlayer insulating film having a plurality of recessed parts separate from one another, and a plurality of protruding parts, each of which includes a vertex formed by one of the plurality of recessed parts and a portion of the interlayer insulating film adjacent to said one recessed part, to thereby form at least three recesses and protrusions repeatedly at a surface of the interlayer insulating film; a plurality of contact holes penetrating the interlayer insulating film in a depth direction and reaching the semiconductor substrate; a first electrode provided in the plurality of contact holes and on the surface of the interlayer insulating film, the first electrode having: a first electrode film in ohmic contact with the second semiconductor region and the plurality of third semiconductor regions in the plurality of contact holes, a second electrode film containing titanium, provided on a surface of the first electrode film and the surface of the interlayer insulating film, and a third electrode film containing aluminum, provided on a surface of the second electrode film, the second electrode film having a recessed and protruding shape reflecting the recesses and the protrusions of the surface of the interlayer insulating film; and a second electrode electrically connected to the first semiconductor region.

In the embodiment, height differences between the recesses and the protrusions of the interlayer insulating film formed at the surface thereof are in a range from 0.1 µm to 0.5 µm.

In the embodiment, the height differences between the recesses and the protrusions of the interlayer insulating film formed at the surface thereof are at most 0.3 µm.

In the embodiment, the recessed parts of the interlayer insulating film include a plurality of first recessed parts, each provided at a top of the interlayer insulating film, corresponding to a recess at a contact surface of one of the plurality of gate electrodes, the contact surface being a surface of said one gate electrode in contact with the interlayer insulating film, and a plurality of second recessed parts, each provided between the top of the interlayer insulating film and a portion of the interlayer insulating film covering a side wall of one of the plurality of contact holes, a surface of the second recessed part being in an arc shape.

In the embodiment, the first recessed parts and the second recessed parts are provided separate from one another, a part of the surface of the interlayer insulating film between one of the first recessed parts and one of the second recessed parts that are next to each other is a first flat surface, and each of the second recessed parts has a depth that is in a range of 20% to 50% of a distance in a depth direction from the first flat surface of the interlayer insulating film to a top of the gate insulating film on the first main surface of the semiconductor substrate.

In the embodiment, the protruding parts include a plurality of first protruding parts each including a first vertex formed by the first flat surface and one of the first or second recessed parts adjacent thereto, the first vertex in a cross-sectional view being of an obtuse angle of at least 100 degrees.

In the embodiment, the greater is proximity of a first protruding part of the plurality of first protruding parts to one of the plurality of trenches, the greater is the angle of the first vertex thereof in the cross-sectional view.

In the embodiment, the angle of one of the first protruding parts that is disposed at a position closest to the one of the plurality of trenches is at least 110 degrees in the cross-sectional view.

In the embodiment, the portion of the interlayer insulating film covering the side wall of each of the plurality of contact holes has a second flat surface, which is sloped with respect to the first main surface of the semiconductor substrate. The protruding parts further include a plurality of second protruding parts each including a second vertex formed by the second flat surface and one of the second recessed parts adjacent thereto, the second vertex in the cross-sectional view being of an obtuse angle of at least 100 degrees.

In the embodiment, the angle of each of the second vertices is smaller than the angle of each of the first vertices in the cross-sectional view.

According to another embodiment of the invention, a silicon carbide semiconductor device includes a semiconductor substrate having first and second main surfaces opposite to each other; a first semiconductor region of a first conductivity type, provided in the semiconductor substrate; a second semiconductor region of a second conductivity type, provided in the semiconductor substrate, between the first main surface of the semiconductor substrate and the first semiconductor region, and in contact with the first semiconductor region; a plurality of third semiconductor regions of the first conductivity type, selectively provided in the semiconductor substrate, between the first main surface of the semiconductor substrate and the second semiconductor region, and in contact with the second semiconductor region; a plurality of trenches each penetrating one of the plurality of third semiconductor regions and penetrating the second semiconductor region from the first main surface of the semiconductor substrate, reaching the first semiconductor region; a plurality of gate electrodes each provided in one of the plurality of trenches, via a gate insulating film; an interlayer insulating film covering the plurality of gate electrodes, the interlayer insulating film having a plurality of recessed parts, to thereby form at least three recesses and protrusions repeatedly at a surface of the interlayer insulating film; a plurality of contact holes penetrating the interlayer insulating film in a depth direction and reaching the semiconductor substrate, each of the plurality of contact holes having one of the recessed parts formed at a predetermined depth that is less than a thickness of the interlayer insulating film and continuously with said each contact hole, such that an opening width of said each contact hole is made wider at a first position by said one recessed part than at a second position that is closer to the semiconductor substrate than is the first position; a first electrode provided in the plurality of contact holes and on the surface of the interlayer insulating film, the first electrode having: a first electrode film in ohmic contact with the second semiconductor region and the plurality of third semiconductor regions in the plurality of contact holes, a second electrode film containing titanium, provided on a surface of the first electrode film and the surface of the interlayer insulating film, and a third electrode film containing aluminum, provided on a surface of the second electrode film, the second electrode film having a recessed and protruding shape reflecting the recesses and the protrusions of the surface of the interlayer insulating film; and a second electrode electrically connected to the first semiconductor region.

According to yet another embodiment of the invention, a method of manufacturing a silicon carbide semiconductor device, includes preparing a semiconductor substrate having a first main surface and a second main surface opposite to one another; forming a plurality of trenches reaching a predetermined depth from the first main surface of the semiconductor substrate; forming a gate insulating film on the first main surface of the semiconductor substrate and on an inner wall of each of the plurality of trenches; depositing a polysilicon layer on the first main surface of the semiconductor substrate, and in the plurality of trenches; etching the polysilicon layer until the gate insulating film on the first main surface of the semiconductor substrate is exposed, leaving the polysilicon layer in the plurality of trenches to form a plurality of gate electrodes, each of the plurality of gate electrodes having a recess at a surface thereof; forming an interlayer insulating film on the first main surface of the semiconductor substrate, covering the plurality of gate electrodes, and forming, at a surface of the interlayer insulating film, a plurality of first recessed parts respectively reflecting the recesses at the surfaces of the gate electrodes; forming a plurality of contact holes penetrating the interlayer insulating film in a depth direction and reaching the semiconductor substrate by: a mask formation process of forming, at the surface of the interlayer insulating film, an etching mask having openings at parts corresponding to formation regions of the plurality of contact holes, a first groove formation process of forming a plurality of first grooves of a predetermined depth from the surface of the interlayer insulating film through an isotropic etching using the etching mask, a second groove formation process of forming a plurality of second grooves penetrating the interlayer insulating film in the depth direction respectively from surfaces of the plurality of first grooves through an anisotropic etching using the etching mask, and a removal process of removing the etching mask; planarizing the interlayer insulating film through a heat treatment; forming a first electrode film in ohmic contact with the semiconductor substrate in the plurality of contact holes; forming a second electrode film containing titanium, on a surface of the first electrode film and the surface of the interlayer insulating film; and forming a third electrode film containing aluminum, on a surface of the second electrode film.

In the embodiment, the recess at the surface of each gate electrode has a depth that is at least 0.1 µm but less than 0.5 µm.

In the embodiment, in the first groove formation process, the predetermined depth of the plurality of first grooves is in a range from 20% to 50% of a distance in the depth direction between the surface of the interlayer insulating film excluding the plurality of first recessed parts, to a top of the gate insulating film on the first main surface of the semiconductor substrate.

In the embodiment, forming the interlayer insulating film includes sequentially depositing a first insulating layer and a second insulating layer, the second insulating layer having a boron concentration in a range from 1 wt % to 3 wt % and a phosphorus concentration in a range from 1 wt % to 3 wt %, respectively higher than those of the first insulating layer. In the first groove formation process, the plurality of first grooves is formed at the second insulating layer. In the second groove formation process, the plurality of second grooves are each formed penetrating the second insulating layer and the first insulating layer in the depth direction from a bottom of each of the plurality of first grooves. The heat treatment for planarizing the interlayer insulating film is performed at a temperature that is at most 1000 degrees C.

Objects, features, and advantages of the present invention are specifically set forth in or will become apparent from the following detailed description of the invention when read in conjunction with the accompanying drawings.

DETAILED DESCRIPTION OF THE INVENTION

Figure 11:
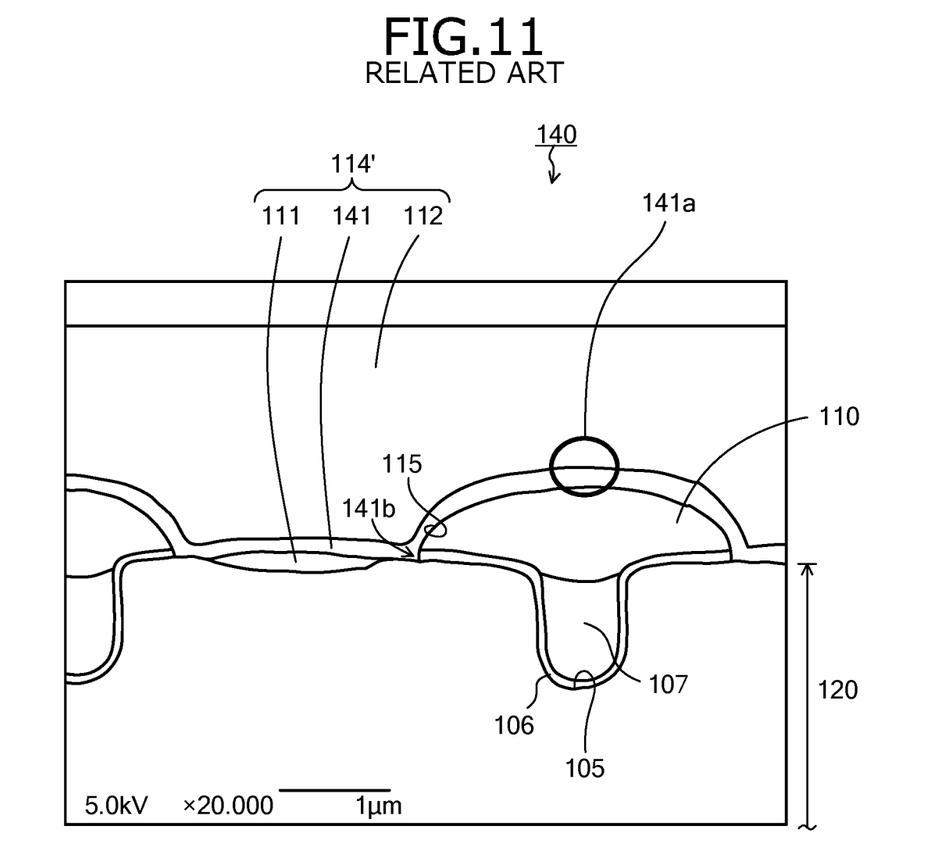
FIG. 11 is a cross-sectional view schematically depicting a state when an interlayer insulating film and a barrier metal of the conventional silicon carbide semiconductor device is observed.

First, problems associated with the conventional techniques will be described. In the conventional silicon carbide semiconductor device 130 (refer to FIG. 10), when the stacked film including a titanium film and a titanium nitride film is used as the barrier metal, the following problem occurs. FIG. 11 is a cross-sectional view schematically depicting a state when the interlayer insulating film and the barrier metal of the conventional silicon carbide semiconductor device is observed. A conventional silicon carbide semiconductor device 140 depicted in FIG. 11 differs from the conventional silicon carbide semiconductor device 130 depicted in FIG. 10 in that a barrier metal 141 is provided between the nickel silicide film 111 and the metal electrode layer 112 containing Al.

In FIG. 11, a state of the interlayer insulating film 110 and the barrier metal 141 of the conventional silicon carbide semiconductor device 140 as observed under a scanning electron microscope (SEM) is depicted. In FIG. 11, parts in the semiconductor substrate 120 other than the trenches 105, the gate insulating film 106, and the gate electrodes 107 are not depicted. The metal electrode layer 112 containing Al, for example, is an aluminum-silicon film.

The barrier metal 141 is provided spanning a surface of the nickel silicide film 111 and the surface of the interlayer insulating film 110. The barrier metal 141, for example, is a stacked film including a titanium nitride film, a titanium film, and a titanium nitride film stacked sequentially. The titanium film and the titanium nitride film configuring the barrier metal 141 is strong against stress. Therefore, when the top of the interlayer insulating film 110 is a curved surface protruding in a direction away from the semiconductor substrate 120, step coverage of the barrier metal 141 on the interlayer insulating film 110 becomes poor.

The barrier metal 141, at sites where the step coverage is poor, has a high rate of non-smooth continuity and the recesses and the protrusions of the surface become larger. In the barrier metal 141, parts having large recesses and protrusions of the surface contract under tensile stress and the barrier metal 141 becomes susceptible to stress at these parts. The parts of the barrier metal 141 having large recesses and protrusions of the surface, in particular, for example, are parts 141a of the barrier metal 141 directly above the trenches 105. Parts of the barrier metal 141 on the nickel silicide film 111 have favorable step coverage and do not contract.

Deformation of the barrier metal 141 due to differences in the stress applied to the barrier metal 141 causes cracks and peeling of the barrier metal 141. Regarding cracks and peeling of the barrier metal 141, the following was confirmed through earnest research by the inventors. Main base points of the cracks of the barrier metal 141 are borders 141b between sidewalls of the contact holes 115 and the front surface of the semiconductor substrate 120. The cracks of the barrier metal 141 occur randomly without regularity and are not present in a layout of the gate electrodes 107. The barrier metal 141 peels from the cracks of the barrier metal 141.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
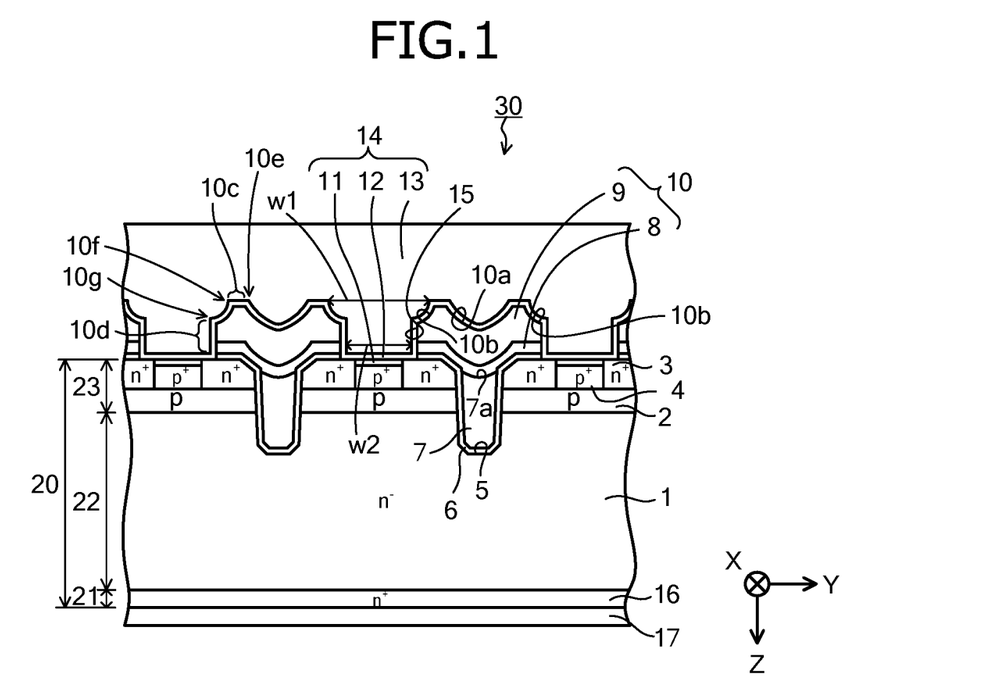
FIG. 1 is a cross-sectional view depicting a structure of a silicon carbide semiconductor device according to an embodiment.
Figure 2:
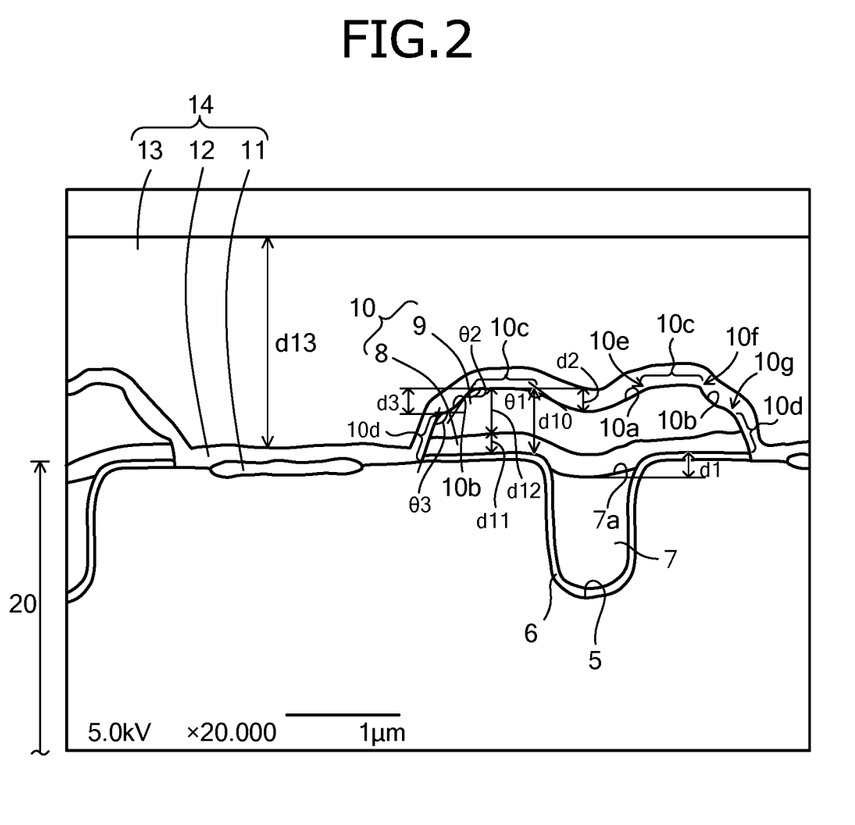
FIG. 2 is an enlarged view of a part of FIG. 1.

A structure of a silicon carbide semiconductor device according to an embodiment will be described. FIG. 1 is a cross-sectional view depicting the structure of the silicon carbide semiconductor device according to the embodiment. FIG. 2 is an enlarged view of a part of FIG. 1. FIG. 2 schematically depicts a state when an interlayer insulating film 10 and a barrier metal 12 on a semiconductor substrate (semiconductor chip) 20 depicted in FIG. 1 are observed under a scanning electron microscope. In FIG. 2, parts in the semiconductor substrate 20 other than trench gates are not depicted.

A silicon carbide semiconductor device 30 according to the embodiment depicted in FIGS. 1 and 2 is a vertical trench-gate-type SiC-MOSFET that includes general trench gates at a front side of the semiconductor substrate 20 that contains silicon carbide, each of the trench gates having three recessed parts (one first recessed part 10a described hereinafter and two second recessed parts 10b described hereinafter) at a surface of the interlayer insulating film 10 covering the gate electrodes 7. The trench gates are configured by trenches 5, a gate insulating film 6, and the gate electrodes 7 described hereinafter.

In the semiconductor substrate 20, an $n^-$-type drift region (first semiconductor region) 1 is provided. Between a front surface of the semiconductor substrate 20 and the $n^-$-type drift region 1, a p-type base region (second semiconductor region) 2 is provided in contact with the $n^-$-type drift region 1. Between the front surface of the semiconductor substrate 20 and the p-type base region 2, $n^+$-type source regions (third semiconductor regions) 3 and $p^+$-type contact regions 4 are each selectively provided in contact with the p-type base region 2.

The $n^+$-type source regions 3 and the $p^+$-type contact regions 4 are exposed at the front surface of the semiconductor substrate 20. The $p^+$-type contact regions 4 may be omitted. When the $p^+$-type contact regions 4 are omitted, instead of the $p^+$-type contact regions 4, the p-type base region 2 is exposed at the front surface of the semiconductor substrate 20. The $n^+$-type source regions 3 have a depth that is, for example, about 0.5 μm from the front surface of the semiconductor substrate 20.

The semiconductor substrate 20 may be an epitaxial substrate fabricated by sequentially stacking, on an $n^+$-type starting substrate 21 containing silicon carbide, epitaxial layers 22, 23 that form the $n^-$-type drift region 1 and the p-type base region 2. In this case, the $n^+$-type source regions 3 and the $p^+$-type contact regions 4 are each provided in a surface region of the p-type epitaxial layer 23, and parts of the p-type epitaxial layer 23 excluding the surface regions are the p-type base region 2.

The trenches 5 each penetrates through one of the $n^+$-type source regions 3 and the p-type base region 2 from the front surface of the semiconductor substrate 20, and reaches the $n^-$-type drift region 1. Upper corner parts and bottom corner parts of the trenches 5 may be rounded to have a predetermined curvature. The upper corner parts of the trenches 5 are each a border between the front surface of the semiconductor substrate 20 and a sidewall of one of the trenches 5. The bottom corner parts of the trenches 5 are each a border between a bottom and a sidewall of one of the trenches 5.

In each of the trenches 5, the gate insulating film 6 is provided along an inner wall of the trench 5. The gate insulating film 6 extends from the sidewall of the trench 5 to the front surface of the semiconductor substrate 20. In the trenches 5, the gate electrodes 7 containing, for example, polysilicon (poly-Si), are provided on the gate insulating film 6, respectively. At a top (contact surface with the interlayer insulating film 10) of each of the gate electrodes 7, a recess 7a that is recessed deepest toward a drain side (bottom of the trench 5) occurs at substantially a center of the trench 5.

The recesses 7a at the tops of the gate electrodes 7 occur due to etching of a later-described polysilicon layer 41 (refer to FIG. 3) for forming the gate electrodes 7. The recesses 7a at the tops of the gate electrodes 7 have a depth d1 so that parts of the gate electrodes 7 along sidewalls of the trenches 5 face the $n^+$-type source regions 3, across the gate insulating film 6 and, for example, at parts (substantially centers of the trenches 5) that are deepest, the depth d1 suffices to be in a range from about 0.1 μm to less than 0.5 μm or at most about 0.3 μm.

The interlayer insulating film 10 has a two-layer structure in which first and second insulation layers 8, 9 are sequentially stacked on the front surface of the semiconductor substrate 20. The first insulation layer 8 is free of boron (B) and phosphorus (P), or is formed using an insulating material having an extremely low boron concentration and phosphorus concentration compared to the second insulation layer 9. The second insulation layer 9 is formed using an insulating material that contains boron and phosphorus at predetermined concentrations described hereinafter. The second insulation layer 9 has a softening point that is lower than a softening point of the first insulation layer 8.

In particular, the first insulation layer 8, for example, is a non-doped silicate glass (NSG) film. The first insulation layer 8 has a function of preventing the diffusion of boron and phosphorus in the second insulation layer 9 to the gate electrodes 7. The first insulation layer 8 may contain boron and phosphorus diffused from the second insulation layer 9. The first insulation layer 8 covers the gate insulating film 6 at the front surface of the semiconductor substrate 20 and the tops of the gate electrodes 7.

When the tops of the gate electrodes 7 are at deep positions closer to a drain than are the upper corner parts of the trenches 5, the first insulation layer 8 further covers the gate insulating film 6 on surfaces of the upper corner parts of the trenches 5. A thickness d11 of the first insulation layer 8 is substantially uniform at an entire area of the front surface of the semiconductor substrate 20 and, for example, is in a range from about 100 nm to 300 nm. The thickness being substantially uniform means a same thickness within a range that includes an allowable error due to process variation.

The second insulation layer 9 is provided on the first insulation layer 8. The second insulation layer 9 is not in contact with the gate insulating film 6 and the gate electrodes 7. The second insulation layer 9 is, for example, a BPSG film and has a boron concentration and a phosphorus concentration that are higher than those of the second insulating layer 109 (refer to FIGS. 10, 11) configuring the conventional structure. The first insulation layer 8 is disposed between the second insulation layer 9 and the gate electrodes 7, thereby enabling suppression of conductivity fluctuation of the gate electrodes 7 due to the boron and the phosphorus in the second insulation layer 9.

The boron concentration of the second insulation layer 9, for example, is in a range from about 1 wt % to 3 wt %, or may be in a range from about 1.6 wt % to 2.6 wt %. The phosphorus concentration of the second insulation layer 9, for example, is in a range from about 1 wt % to 3 wt %, or may be within a range from about 1.5 wt % to 2.5 wt %. A reason for this is that by setting the boron concentration and the phosphorus concentration of the second insulation layer 9 to be within the ranges described above, compared to the conventional method, even when a reflow temperature of the interlayer insulating film 10 is reduced, the second insulation layer 9 flows easily.

When the boron concentration and the phosphorus concentration of the second insulation layer 9 are less than the lower limit values above, the reflow temperature of the interlayer insulating film 10 cannot be set low compared to the conventional method. A reason for this is that when the boron concentration and the phosphorus concentration of the second insulation layer 9 are less than the lower limit values described above and the reflow temperature of the interlayer insulating film 10 becomes low compared to the conventional method, the second insulation layer 9 does not flow easily and the first and the second recessed parts 10a, 10b, and first and second flat surfaces 10c, 10d described hereinafter cannot be formed at a surface of the second insulation layer 9. When the boron concentration and the phosphorus concentration of the second insulation layer 9 exceed the upper limit values described above, peeling of the second insulation layer 9 is caused.

The second insulation layer 9 has a thickness d12 that is thicker than the thickness d11 of the first insulation layer 8 and in a range, for example, from about 400 nm to 800 nm. The interlayer insulating film 10 has a total thickness d10 that is a thickness enabling electrical insulation of the gate electrodes 7 and a source electrode (first electrode) 14 and is, for example, about 800 nm (for example, the thickness d11 of the first insulation layer 8 is about 200 nm and the thickness d12 of the second insulation layer 9 is about 600 nm). Recesses and protrusions are formed at the surface of the interlayer insulating film 10 by the first and the second recessed parts 10a, 10b and protruding parts 10e, 10f, 10g described hereinafter whereby, the total thickness d10 of the interlayer insulating film 10 for electrically insulating the gate electrodes 7 and the source electrode 14 may be easily secured.

At the top of the interlayer insulating film 10, at parts (i.e., substantially centers of the trenches 5) facing, in a depth direction Z, the recesses 7a of the tops of the gate electrodes 7 therebeneath, the first recessed parts 10a recessed reflecting the recesses 7a of the tops of the gate electrodes 7 are provided. The top of the interlayer insulating film 10 is a part of the surface of the interlayer insulating film 10 in contact with the barrier metal 12, excluding the surface forming sidewalls of contact holes 15.

As depicted in FIG. 1, at borders between the top of the interlayer insulating film 10 and the side surfaces of the interlayer insulating film 10 (hereinafter, upper ends of the side surfaces of the interlayer insulating film 10), the second recessed parts 10b recessed in an arc shape protruding downward are formed at the surface of the second insulation layer 9 by removing upper ends of the side surfaces of the interlayer insulating film 10 in a fan shape in a cross-sectional view. The second recessed parts 10b are formed by parts remaining as sidewalls and bottom corner parts of first grooves 15a (refer to FIG. 8) formed in the second insulation layer 9 by isotropic etching described hereinafter. The bottom corner parts of the first grooves 15a are each a border between the bottom and the sidewalls of the first grooves 15a.

Further, for example, as depicted in FIG. 2, the second recessed parts 10b of the upper ends of the side surfaces of the interlayer insulating film 10 may have a shape such that the upper ends of the side surfaces of the interlayer insulating film 10 are chamfered for a depth d3 described hereinafter. The chamfered shape of upper ends of the side surfaces of the interlayer insulating film 10, for example, is a flat surface having a slope that is greater than that of the side surfaces of the interlayer insulating film 10 with respect to the front surface of the semiconductor substrate 20, or is a curved surface that is nearly a flat surface slightly curved to protrude downward and having a slope that is greater than that of the side surfaces of the interlayer insulating film 10 with respect to the front surface of the semiconductor substrate 20.

A depth d2 of the first recessed parts 10a of the top of the interlayer insulating film 10 is substantially equal to the depth d1 of the recesses 7a of the tops of the gate electrodes 7. The depths being substantially equal means that the depths are within a range that includes an allowable error due to process variation. The depth d3 of the second recessed parts 10b of the upper ends of the side surfaces of the interlayer insulating film 10 is a radius of the second recessed parts 10b having an arc shape, is at least about 0.1 µm from the top of the interlayer insulating film 10, and is a depth in a range from about 20% to 50% of a maximum value of the total thickness d10 of the interlayer insulating film 10.

Between each of the first recessed parts 10a of the top of the interlayer insulating film 10 and the second recessed parts 10b adjacent thereto, is the first flat surface 10c that smoothly connects respective inner walls of the first and the second recessed parts 10a, 10b. The side surfaces of the interlayer insulating film 10 are the second flat surfaces 10d that smoothly connect inner walls of the second recessed parts 10b of the upper ends of the side surfaces of the interlayer insulating film 10. The first recessed parts 10a are substantially parallel to the front surface of the semiconductor substrate 20. The second flat surfaces 10d may have a slope with respect to the front surface of the semiconductor substrate 20.

At the surface of the interlayer insulating film 10, the inner walls of the first and the second recessed parts 10a, 10b and the first and the second flat surfaces 10c, 10d are each one side, and borders between two of these sides form vertices that are the protruding parts 10e to 10g having, in a cross-sectional view, a substantially triangular shape. The angles θ1, θ2, θ3 of the vertices of the protruding parts 10e to 10g are obtuse angles of, for example, at least 100 degrees. The first and the second recessed parts 10a, 10b enable the protruding parts 10e to 10g that are vertices having obtuse angles to be increased at the surface of the interlayer insulating film 10 compared to the conventional structure (refer to FIG. 11).

In particular, in the embodiment, between each of the first recessed parts 10a of the top of the interlayer insulating film 10 and the side surfaces (the second flat surfaces 10d) adjacent thereto of the interlayer insulating film 10, three protruding parts (indicated by reference characters 10e to 10g) are each formed and therefore, a total of six protruding parts are formed at the surface of the interlayer insulating film 10. On the other hand, in the conventional structure (refer to FIGS. 10, 11), the surface of the interlayer insulating film 110 is smoothly connected from the side surfaces of the interlayer insulating film 110 to the top and therefore, protruding parts are not present at the surface of the interlayer insulating film 110.

The angles θ1 to θ3 of the vertices are greater with greater proximity of the position of the protruding parts 10e to 10g to the trenches 5. In other words, the angle θ1 of the vertex of the protruding part 10e formed by an inner wall of one of the first recessed parts 10a and the first flat surface 10c may be the obtuse angle that is the greatest and, for example, at least about 110 degrees. The angle θ2 of the vertex of the protruding part 10f formed by the first flat surface 10c and an inner wall of one of the second recessed parts 10b, and the angle θ3 of the vertex of the protruding part 10g formed by the inner wall of the one of the second recessed parts 10b and one of the second flat surfaces 10d are smaller than the angle θ1 of the vertex of the protruding part 10e (θ1>θ2, θ1>θ3).

In this manner, the first and the second recessed parts 10a, 10b are provided separate from one another at the surface of the interlayer insulating film 10, whereby at least three repeating recesses and protrusions are formed at the surface of the interlayer insulating film 10, by the first and the second recessed parts 10a, 10b and the protruding parts 10e to 10g that are vertices of borders between inner walls of the first and the second recessed parts 10a, 10b and the first and the second flat surfaces 10c, 10d. A height difference of the recesses and the protrusions due to the first and the second recessed parts 10a, 10b and the protruding parts 10e to 10g of the surface of the interlayer insulating film 10 corresponds to the depths d2, d3 of the first and the second recessed parts 10a, 10b of the surface of the interlayer insulating film 10 and is substantially equal to the depth d1 of the recesses 7a of the tops of the gate electrodes 7.

The contact holes 15 are provided penetrating the interlayer insulating film 10 in the depth direction and reaching the semiconductor substrate 20. In the contact holes 15, the $n^+$-type source regions 3 and the $p^+$-type contact regions 4 are exposed. An opening width of the contact holes 15 along a direction (horizontal direction Y) in which the trenches 5 are arranged is one-step wider (w1>w2) at an upper end side separate from the semiconductor substrate 20 than closer to the semiconductor substrate 20 due to the second recessed parts 10b that are at the upper ends of the side surfaces of the interlayer insulating film 10 and continuous with the contact holes 15.

The source electrode 14 is configured by a nickel silicide film (first electrode film) 11, a barrier metal (second electrode film) 12, and a metal electrode layer (Al metal electrode layer: third electrode film) 13 that contains aluminum (Al). The nickel silicide film 11 is a lowermost layer in ohmic contact with parts (the $n^+$-type source regions 3 and the $p^+$-type contact regions 4, or only the $p^+$-type contact regions 4) of the front surface of the semiconductor substrate 20 exposed in the contact holes 15, and forms an ohmic contact between the source electrode 14 and the semiconductor substrate 20.

The barrier metal 12 is provided having a substantially uniform thickness along the surface of the interlayer insulating film 10 from a surface of the nickel silicide film 11 and forms an uneven shape that reflects the recesses and the protrusions due to the first and the second recessed parts 10a, 10b and the protruding parts 10e to 10g of the surface of the interlayer insulating film 10. The barrier metal 12 has a function of preventing the diffusion of aluminum atoms from the Al metal electrode layer 13 to the semiconductor substrate 20. The barrier metal 12 has a function of preventing interaction between the Al metal electrode layer 13 and the semiconductor substrate 20 during a manufacturing process.

The barrier metal 12 is a single layer constituted by a titanium (Ti) film or a titanium nitride (TiN) film, or has a stacked structure in which these are arbitrarily stacked in plural and, for example, may be a stacked film having a three-layered structure in which a titanium nitride film, a titanium film, and a titanium nitride film are sequentially stacked. The Al metal electrode layer 13 that is the uppermost layer is, for example, an aluminum-silicon (AlSi) film. The Al metal electrode layer 13 has a thickness d13 that is, for example, about 5 µm.

In a surface region of a back surface of the semiconductor substrate 20, an n+-type drain region 16 is provided spanning an entire area of the back surface of the semiconductor substrate 20. When the semiconductor substrate 20 is the epitaxial substrate described above, the n+-type starting substrate 21 is the n+-type drain region 16. A drain electrode (second electrode) 17 is provided at an entire area of the back surface of the semiconductor substrate 20. The drain electrode 17 is in ohmic contact with the n+-type drain region 16.

Next, a method of manufacturing the silicon carbide semiconductor device according to the embodiment will be described. FIGS. 3, 4, 5, 6, 7, 8 and 9 are cross-sectional views depicting states during manufacture of the silicon carbide semiconductor device according to the embodiment. First, on the front surface of the n+-type starting substrate 21 containing silicon carbide, the epitaxial layers 22, 23 (refer to FIG. 1) are sequentially stacked, thereby fabricating the semiconductor substrate (semiconductor wafer) 20. A main surface of the semiconductor substrate 20 having the p-type epitaxial layer 23 is the front surface and a main surface of the semiconductor substrate 20 having the n+-type starting substrate 21 is the back surface.

Figure 3:
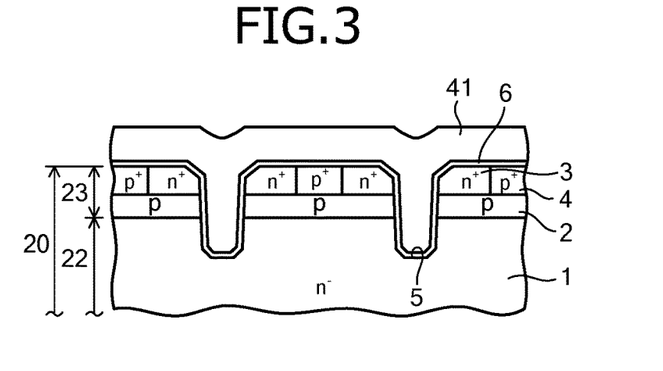
FIG. 3 is a cross-sectional view depicting a state during manufacture of the silicon carbide semiconductor device according to the embodiment.

Next, as depicted in FIG. 3, a process including photolithography and ion implantation as one set is performed repeatedly under differing conditions, thereby selectively forming in surface regions of the front surface of the semiconductor substrate 20, the n+-type source regions 3 and the p+-type contact regions 4 in the p-type epitaxial layer 23. As a result, parts of the p-type epitaxial layer 23 excluding the n+-type source regions 3 and the p+-type contact regions 4 form the p-type base region 2.

Next, the trenches 5 are formed penetrating the n+-type source regions 3 and the p-type base region 2 from the front surface of the semiconductor substrate 20 and reaching the n−-type epitaxial layer 22 that is the n−-type drift region 1 (first process). Next, along the front surface of the semiconductor substrate 20 and inner walls of the trenches 5, the gate insulating film 6 is formed (second process). Next, on the front surface of the semiconductor substrate 20, the polysilicon layer 41 is deposited and the interior of the trenches 5 is completely filled by the polysilicon layer 41 (third process).

Figure 4:
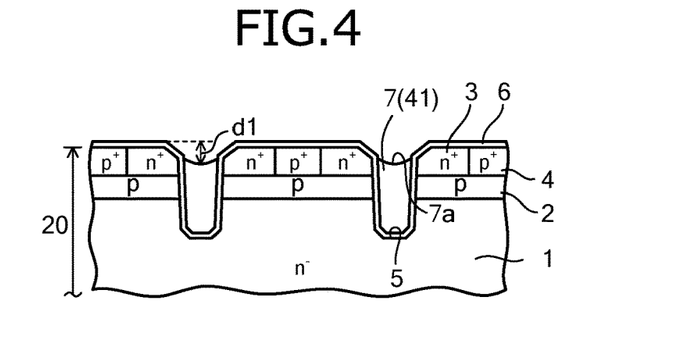
FIG. 4 is a cross-sectional view depicting a state during manufacture of the silicon carbide semiconductor device according to the embodiment.

Next, as depicted in FIG. 4, the polysilicon layer 41 is etched using the gate insulating film 6 on the front surface of the semiconductor substrate 20 as an etching stop layer, until the gate insulating film 6 on the front surface of the semiconductor substrate 20 is exposed. Further, the polysilicon layer 41 is over-etched by a predetermined etching amount, whereby the surface of the polysilicon layer 41 in the trenches 5 is depressed to a position lower than the top of the gate insulating film 6 on the front surface of the semiconductor substrate 20 by the depth d1 (fourth process).

As a result, the polysilicon layer 41 is left only in the trenches 5 and forms the gate electrodes 7, and the recess 7a occurs at the top of each of the gate electrodes 7. The etching of the polysilicon layer 41 may be chemical dry etching (CDE) in which silicon (the polysilicon layer 41) is etched by highly reactive fluorine radicals generated by a mixed gas plasma in which, for example, oxygen ($O_2$) is added to carbon tetrafluoride ($CF_4$).

Figure 5:
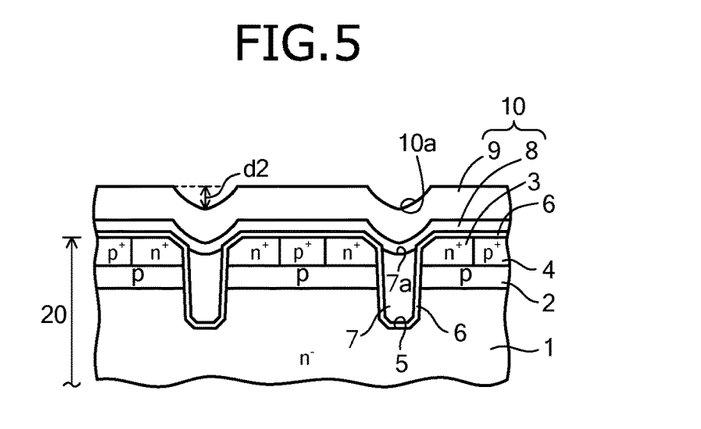
FIG. 5 is a cross-sectional view depicting a state during manufacture of the silicon carbide semiconductor device according to the embodiment.

Next, as depicted in FIG. 5, at the surface of the gate insulating film 6 on the front surface of the semiconductor substrate 20 and at the tops of the gate electrodes 7, for example, a NSG and a BPSG are sequentially deposited as the first and the second insulation layers 8, 9 of the interlayer insulating film 10 (fifth process). At the surface of the interlayer insulating film 10, recesses occur where the top of the second insulation layer 9 is recessed, reflecting the recesses 7a of the tops of the gate electrodes 7. The recesses of the surface of the interlayer insulating film 10 are left as the first recessed parts 10a. The depth d2 of the first recessed parts 10a is substantially equal to the depth d1 of the recesses 7a of the tops of the gate electrodes 7.

Figure 6:
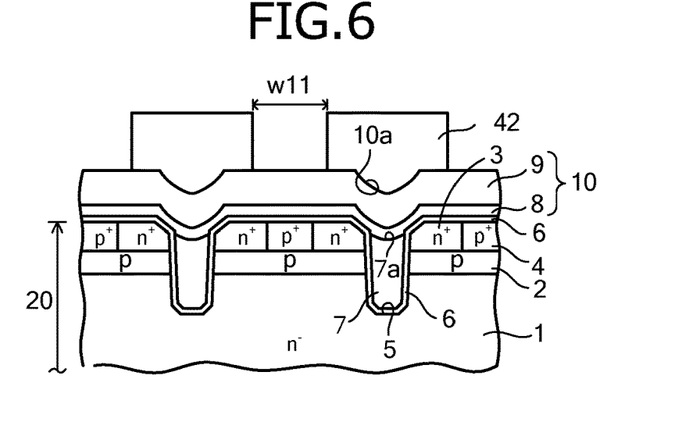
FIG. 6 is a cross-sectional view depicting a state during manufacture of the silicon carbide semiconductor device according to the embodiment.
Figure 7:
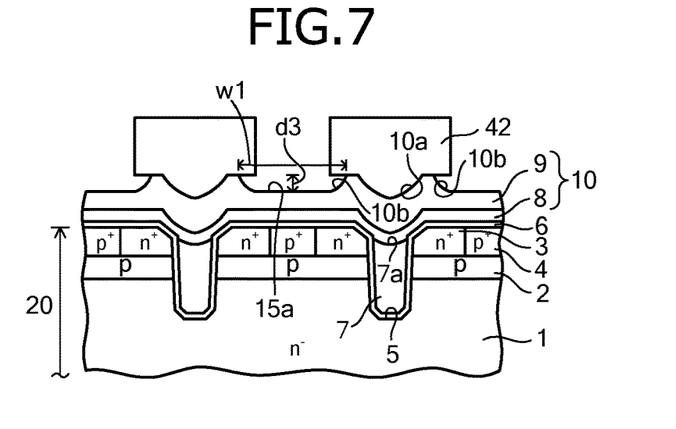
FIG. 7 is a cross-sectional view depicting a state during manufacture of the silicon carbide semiconductor device according to the embodiment.

Next, as depicted in FIG. 6, at the surface of the interlayer insulating film 10, a resist film 42 opened at parts corresponding to formation regions of the contact holes 15 is formed (mask formation process). The resist film 42 is formed so as to cover the first recessed parts 10a of the top of the second insulation layer 9. Next, as depicted in FIG. 7, the interlayer insulating film 10 is selectively removed by isotropic etching such as by, for example, CDE using the resist film 42 as an etching mask, and the first grooves 15a of the predetermined depth d3 are formed at the top of the second insulation layer 9 (first groove formation process).

Here, the isotropic etching is performed for a certain period of time set in advance, forming the top of the first grooves 15a of the predetermined depth d3 (for example, about 0.3 µm) in the second insulation layer 9. The isotropic etching of the interlayer insulating film 10 advances in the depth direction Z and in horizontal directions X, Y. Therefore, the interlayer insulating film 10 is etched (side etched) to directly beneath the resist film 42 and a width (opening width w1) of the first grooves 15a along the horizontal direction Y becomes wider than an opening width w11 of the resist film 42 along the horizontal direction Y.

Figure 8:
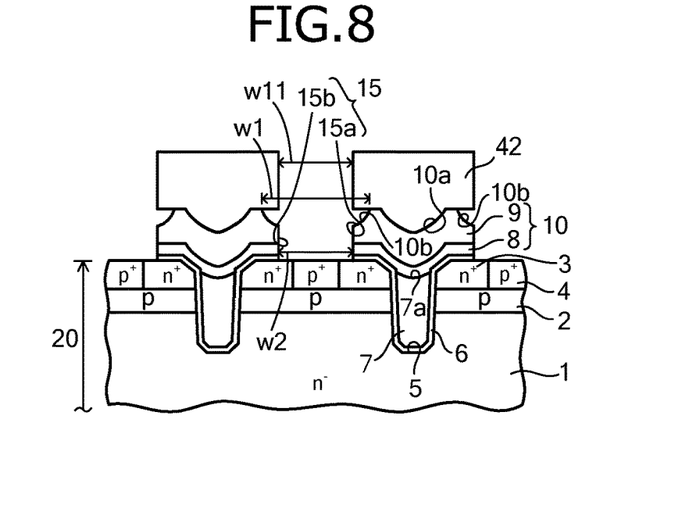
FIG. 8 is a cross-sectional view depicting a state during manufacture of the silicon carbide semiconductor device according to the embodiment.

Next, as depicted in FIG. 8, by anisotropic etching using the resist film 42 as an etching mask, the interlayer insulating film 10 is selectively removed, and second grooves 15b that penetrate the interlayer insulating film 10 in the depth direction Z from the bottoms of the first grooves 15a are formed (second groove formation process). The anisotropic etching does not substantially advance in the horizontal directions X, Y and therefore, a width (opening width w2) of the second grooves 15b along the horizontal direction Y becomes substantially equal to the opening width w11 of the resist film 42 along the horizontal direction Y and becomes narrower than the width (opening width w1) of the first grooves 15a along the horizontal direction Y.

The contact holes 15 are formed by the first and the second grooves 15a, 15b that are continuous along the depth direction Z (sixth process). The opening width of each of the contact holes 15 along the horizontal direction Y is one-step wider closer to the opening that is separate from the semiconductor substrate 20 than at a part closer to the semiconductor substrate 20, due to the difference in the widths of the first and the second grooves 15a, 15b along the horizontal direction Y. The sidewalls and the bottom corner parts of the first grooves 15a left at the upper corner parts of the contact holes 15 are the second recessed parts 10b of the upper ends of the side surfaces of the interlayer insulating film 10.

Figure 9:
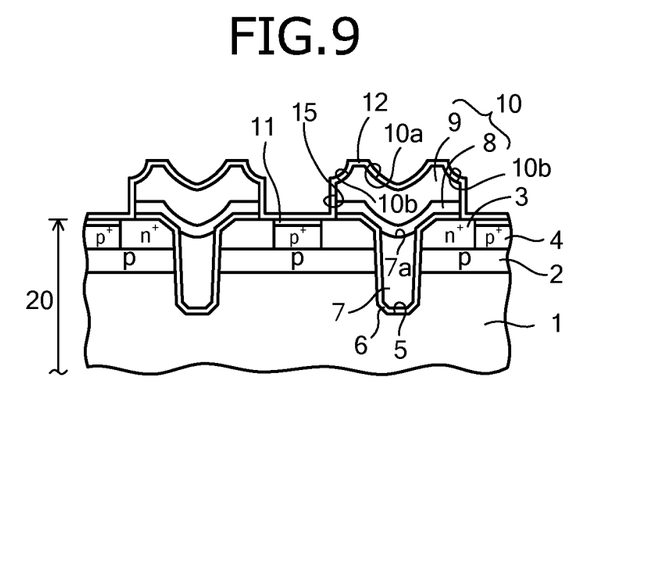
FIG. 9 is a cross-sectional view depicting a state during manufacture of the silicon carbide semiconductor device according to the embodiment.

Next, as depicted in FIG. 9, the resist film 42 is removed (removal process) and thereafter, the interlayer insulating film 10 is flattened by softening and flowing the second insulation layer 9 (reflow process) by a heat treatment at a low temperature (reflow temperature) of about, for example, 1000 degrees C. (seventh process). The reflow temperature for the interlayer insulating film 10 is set within the range described above, whereby the first and the second recessed parts 10a, 10b and the first and the second flat surfaces 10c, 10d may be left at the surface of the second insulation layer 9 after the reflow of the interlayer insulating film 10.

Further, by setting the upper limit value of the reflow temperature for the interlayer insulating film 10 in the range described above, the gate electrodes 7 are not heated by a temperature exceeding 1000 degrees C. and therefore, degradation of gate characteristics may be prevented. Next, a nickel (Ni) film deposited on the part of the front surface of the semiconductor substrate 20 exposed in the contact holes 15 is caused to react with the semiconductor substrate 20, thereby forming a silicide, whereby the nickel silicide film 11 is formed in ohmic contact with the semiconductor substrate 20 (eighth process).

Next, the barrier metal 12 is formed along parts of the front surface of the semiconductor substrate 20 exposed in the contact holes 15 and the surface of the interlayer insulating film 10 (ninth process). At the surface of the interlayer insulating film 10, the first and the second recessed parts 10a, 10b are provided, whereby the first and the second flat surfaces 10c, 10d are formed, and by the first and the second recessed parts 10a, 10b and the first and the second flat surfaces 10c, 10d, the protruding parts (the first and the second protruding parts) 10e to 10g are created, whereby plural (total of 6 locations) recesses and protrusions are formed.

A contact surface area between the interlayer insulating film 10 and the barrier metal 12 is increased by the recesses and the protrusions due to the first and the second recessed parts 10a, 10b and the protruding parts 10e to 10g of the surface of the interlayer insulating film 10. Therefore, compared to the conventional structure, adhesion between the interlayer insulating film 10 and the barrier metal 12 is enhanced by an anchor effect due to the recesses and the protrusions of the surface of the interlayer insulating film 10. Further, the total thickness d10 of the interlayer insulating film 10 is easily ensured to be a thickness enabling electrical insulation of the barrier metal 12 and the gate electrodes 7 by the protruding parts 10e to 10g of the surface of the interlayer insulating film 10.

Next, the Al metal electrode layer 13 is deposited on the surface of the barrier metal 12 (tenth process), whereby the source electrode 14 is formed configured by the nickel silicide film 11, the barrier metal 12, and the Al metal electrode layer 13. Next, the drain electrode 17 is formed at the back surface (back surface of the n$^+$-type starting substrate 21 that is the n$^+$-type drain region 16) of the semiconductor substrate 20. Thereafter, the semiconductor substrate (semiconductor wafer) 20 is diced (cut) into individual chips (semiconductor chip), whereby the SiC-MOSFET depicted in FIG. 1 is completed.

As described above, according to the embodiment, the first recessed parts recessed according to the recesses of the tops of the plurality of gate electrodes are at the top of the interlayer insulating film. At the borders between the top and the side surfaces of the interlayer insulating film 10 are the second recessed parts formed by removal the upper ends of the side surfaces of the interlayer insulating film in a fan shape. The surface of the interlayer insulating film between the first and the second recessed parts and between the semiconductor substrate and the second recessed parts are flat surfaces. At least three recesses and protrusions formed by the first and the second recessed parts, and the protruding parts that are vertices of borders between the inner walls of the first and the second recessed parts and the first and the second flat surfaces are formed at the surface of the interlayer insulating film.

The interlayer insulating film is flat compared to the conventional structure (for example, refer to FIG. 28 of Japanese Laid-Open Patent Publication No. H7-235676) that only has the first recessed parts at the top of the interlayer insulating film in which the vertices of the protruding parts of the surface of the interlayer insulating film are obtuse angles. The barrier metal has an uneven shape reflecting the recesses and the protrusions of the surface of the interlayer insulating film beneath. The barrier metal having this uneven shape distributes stress applied to the barrier metal. Further, the adhesion of the interlayer insulating film and the barrier metal is enhanced by the anchor effect of the recesses and the protrusions formed at the surface of the interlayer insulating film. As a result, peeling and cracking of the barrier metal may be suppressed.

In the foregoing, the present invention is not limited to the embodiments described above and various modifications are possible within a range not departing from the spirit of the invention. For example, in the embodiments described above, while a case is described in which the surface of the interlayer insulating film has a shape in which at least three recesses and protrusions formed by the first and the second recessed parts and the protruding parts that are vertices of the borders between the inner walls of the first and the second recessed parts and the first and the second flat surfaces repeat, without limitation hereto, the recesses and the protrusions of the surface of the interlayer insulating film suffice to have a height difference within the range described above and plural recessed parts may be formed at the surface of the interlayer insulating film so that the surface of the interlayer insulating film has a shape in which at least four recesses and protrusions repeat.

Further, for example, in the embodiments described above, while a MOSFET is described as an example, without limitation hereto, the invention is applicable to various types of semiconductor devices that may have a trench gate structure such as insulated gate bipolar transistors (IGBTs) and diodes. Further, the present invention is similarly implemented when the conductivity types (n-type, p-type) are reversed.

According to the invention described above, the surface of the interlayer insulating film has a shape in which recesses and protrusions repeat, whereby stress applied to the barrier metal on the surface of the interlayer insulating film is distributed. Further, adhesion of the interlayer insulating film and the barrier metal is enhanced by the anchor effect of the recesses and the protrusions of the surface of the interlayer insulating film.

The silicon carbide semiconductor device and the method of manufacturing a silicon carbide semiconductor device according to the present invention achieve an effect in that peeling and cracking of the barrier metal may be suppressed.

As described above, the silicon carbide semiconductor device and the method of manufacturing a silicon carbide semiconductor device according to the present invention are useful for power semiconductors used in power converting equipment and in power source devices such as in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A silicon carbide semiconductor device, comprising:
 a semiconductor substrate having first and second main surfaces opposite to each other;
 a first semiconductor region of a first conductivity type provided in the semiconductor substrate;
 a second semiconductor region of a second conductivity type provided in the semiconductor substrate, between the first main surface of the semiconductor substrate and the first semiconductor region, and in contact with the first semiconductor region;
a plurality of third semiconductor regions of the first conductivity type, selectively provided in the semiconductor substrate, between the first main surface of the semiconductor substrate and the second semiconductor region, and in contact with the second semiconductor region;
a plurality of trenches, each penetrating one of the plurality of third semiconductor regions and penetrating the second semiconductor region from the first main surface of the semiconductor substrate, reaching the first semiconductor region;
a plurality of gate electrodes each provided in one of the plurality of trenches, via a gate insulating film;
an interlayer insulating film covering each of the plurality of gate electrodes, the interlayer insulating film having a plurality of recessed parts separate from one another, and
a plurality of protruding parts, each of which includes a vertex formed by one of the plurality of recessed parts and a portion of the interlayer insulating film adjacent to said one recessed part,
to thereby form at least three recesses and protrusions repeatedly at a surface of the interlayer insulating film;
a plurality of contact holes penetrating the interlayer insulating film in a depth direction and reaching the semiconductor substrate;
a first electrode provided in the plurality of contact holes and on the surface of the interlayer insulating film, the first electrode having:
a first electrode film in ohmic contact with the second semiconductor region and the plurality of third semiconductor regions in the plurality of contact holes,
a second electrode film containing titanium, provided on a surface of the first electrode film and the surface of the interlayer insulating film, and
a third electrode film containing aluminum, provided on a surface of the second electrode film,
the second electrode film having a recessed and protruding shape reflecting the recesses and the protrusions of the surface of the interlayer insulating film; and
a second electrode electrically connected to the first semiconductor region.

2. The silicon carbide semiconductor device according to claim 1, wherein
height differences between the recesses and the protrusions of the interlayer insulating film formed at the surface thereof are in a range from 0.1 μm to 0.5 μm.

3. The silicon carbide semiconductor device according to claim 2, wherein
the height differences between the recesses and the protrusions of the interlayer insulating film formed at the surface thereof are at most 0.3 μm.

4. The silicon carbide semiconductor device according to claim 1, wherein the recessed parts of the interlayer insulating film include
a plurality of first recessed parts, each provided at a top of the interlayer insulating film, corresponding to a recess at a contact surface of one of the plurality of gate electrodes, the contact surface being a surface of said one gate electrode in contact with the interlayer insulating film, and
a plurality of second recessed parts, each provided between the top of the interlayer insulating film and a portion of the interlayer insulating film covering a side wall of one of the plurality of contact holes, a surface of the second recessed part being in an arc shape.

5. The silicon carbide semiconductor device according to claim 4, wherein
the first recessed parts and the second recessed parts are provided separate from one another,
a part of the surface of the interlayer insulating film between one of the first recessed parts and one of the second recessed parts that are next to each other is a first flat surface, and
each of the second recessed parts has a depth that is in a range of 20% to 50% of a distance in a depth direction from the first flat surface of the interlayer insulating film to a top of the gate insulating film on the first main surface of the semiconductor substrate.

6. The silicon carbide semiconductor device according to claim 5, wherein
the protruding parts include a plurality of first protruding parts each including a first vertex formed by the first flat surface and one of the first or second recessed parts adjacent thereto, the first vertex in a cross-sectional view being of an obtuse angle of at least 100 degrees.

7. The silicon carbide semiconductor device according to claim 6, wherein
the greater is proximity of a first protruding part of the plurality of first protruding parts to one of the plurality of trenches, the greater is the angle of the first vertex thereof in the cross-sectional view.

8. The silicon carbide semiconductor device according to claim 7, wherein
the angle of one of the first protruding parts that is disposed at a position closest to the one of the plurality of trenches is at least 110 degrees in the cross-sectional view.

9. The silicon carbide semiconductor device according to claim 6, wherein
the portion of the interlayer insulating film covering the side wall of each of the plurality of contact holes has a second flat surface, which is sloped with respect to the first main surface of the semiconductor substrate,
the protruding parts further include a plurality of second protruding parts each including a second vertex formed by the second flat surface and one of the second recessed parts adjacent thereto, the second vertex in the cross-sectional view being of an obtuse angle of at least 100 degrees.

10. The silicon carbide semiconductor device according to claim 9, wherein
the angle of each of the second vertices is smaller than the angle of each of the first vertices in the cross-sectional view.

11. A silicon carbide semiconductor device, comprising:
a semiconductor substrate having first and second main surfaces opposite to each other;
a first semiconductor region of a first conductivity type, provided in the semiconductor substrate;
a second semiconductor region of a second conductivity type, provided in the semiconductor substrate, between the first main surface of the semiconductor substrate and the first semiconductor region, and in contact with the first semiconductor region;
a plurality of third semiconductor regions of the first conductivity type, selectively provided in the semiconductor substrate, between the first main surface of the semiconductor substrate and the second semiconductor region, and in contact with the second semiconductor region;

a plurality of trenches each penetrating one of the plurality of third semiconductor regions and penetrating the second semiconductor region from the first main surface of the semiconductor substrate, reaching the first semiconductor region;

a plurality of gate electrodes each provided in one of the plurality of trenches, via a gate insulating film;

an interlayer insulating film covering the plurality of gate electrodes, the interlayer insulating film having a plurality of recessed parts, to thereby form at least three recesses and protrusions repeatedly at a surface of the interlayer insulating film;

a plurality of contact holes penetrating the interlayer insulating film in a depth direction and reaching the semiconductor substrate, each of the plurality of contact holes having one of the recessed parts formed at a predetermined depth that is less than a thickness of the interlayer insulating film and continuously with said each contact hole, such that an opening width of said each contact hole is made wider at a first position by said one recessed part than at a second position that is closer to the semiconductor substrate than is the first position;

a first electrode provided in the plurality of contact holes and on the surface of the interlayer insulating film, the first electrode having:
  a first electrode film in ohmic contact with the second semiconductor region and the plurality of third semiconductor regions in the plurality of contact holes,
  a second electrode film containing titanium, provided on a surface of the first electrode film and the surface of the interlayer insulating film, and
  a third electrode film containing aluminum, provided on a surface of the second electrode film,
  the second electrode film having a recessed and protruding shape reflecting the recesses and the protrusions of the surface of the interlayer insulating film; and
  a second electrode electrically connected to the first semiconductor region.

12. A method according of manufacturing a silicon carbide semiconductor device, the method comprising:
preparing a semiconductor substrate having a first main surface and a second main surface opposite to one another;
forming a plurality of trenches reaching a predetermined depth from the first main surface of the semiconductor substrate;
forming a gate insulating film on the first main surface of the semiconductor substrate and on an inner wall of each of the plurality of trenches;
depositing a polysilicon layer on the first main surface of the semiconductor substrate, and in the plurality of trenches;
etching the polysilicon layer until the gate insulating film on the first main surface of the semiconductor substrate is exposed, leaving the polysilicon layer in the plurality of trenches to form a plurality of gate electrodes, each of the plurality of gate electrodes having a recess at a surface thereof;
forming an interlayer insulating film on the first main surface of the semiconductor substrate, covering the plurality of gate electrodes, and forming, at a surface of the interlayer insulating film, a plurality of first recessed parts respectively reflecting the recesses at the surfaces of the gate electrodes;

forming a plurality of contact holes penetrating the interlayer insulating film in a depth direction and reaching the semiconductor substrate by:
  a mask formation process of forming, at the surface of the interlayer insulating film, an etching mask having openings at parts corresponding to formation regions of the plurality of contact holes,
  a first groove formation process of forming a plurality of first grooves of a predetermined depth from the surface of the interlayer insulating film through an isotropic etching using the etching mask,
  a second groove formation process of forming a plurality of second grooves penetrating the interlayer insulating film in the depth direction respectively from surfaces of the plurality of first grooves through an anisotropic etching using the etching mask, and
  a removal process of removing the etching mask;
planarizing the interlayer insulating film through a heat treatment;
forming a first electrode film in ohmic contact with the semiconductor substrate in the plurality of contact holes;
forming a second electrode film containing titanium, on a surface of the first electrode film and the surface of the interlayer insulating film; and
forming a third electrode film containing aluminum, on a surface of the second electrode film, wherein
the recess at the surface of each gate electrode has a depth that is at least 0.1 μm but less than 0.5 μm.

13. The method according to claim 12, wherein
forming the interlayer insulating film includes sequentially depositing a first insulating layer and a second insulating layer, the second insulating layer having a boron concentration in a range from 1 wt % to 3 wt % and a phosphorus concentration in a range from 1 wt % to 3 wt %, respectively higher than those of the first insulating layer,
in the first groove formation process, the plurality of first grooves is formed at the second insulating layer,
in the second groove formation process, the plurality of second grooves are each formed penetrating the second insulating layer and the first insulating layer in the depth direction from a bottom of each of the plurality of first grooves, and
the heat treatment for planarizing the interlayer insulating film is performed at a temperature that is at most 1000 degrees C.

14. The method according to claim 12, wherein forming the plurality of first recessed parts respectively reflecting the recesses at the surfaces of the gate electrodes includes
forming
  at least three recessed parts separate from one another, and
  at least three protruding parts, each of which includes a vertex formed by one of the at least three recessed parts and a portion of the interlayer insulating film adjacent to said one recessed part,
repeatedly at the surface of the interlayer insulating film, the at least three recesses including a first recessed part corresponding to one of the recesses at the surfaces of the gate electrodes.

15. A method of manufacturing a silicon carbide semiconductor device, the method comprising:
preparing a semiconductor substrate having a first main surface and a second main surface opposite to one another;

forming a plurality of trenches reaching a predetermined depth from the first main surface of the semiconductor substrate;

forming a gate insulating film on the first main surface of the semiconductor substrate and on an inner wall of each of the plurality of trenches;

depositing a polysilicon layer on the first main surface of the semiconductor substrate, and in the plurality of trenches;

etching the polysilicon layer until the gate insulating film on the first main surface of the semiconductor substrate is exposed, leaving the polysilicon layer in the plurality of trenches to form a plurality of gate electrodes, each of the plurality of gate electrodes having a recess at a surface thereof;

forming an interlayer insulating film on the first main surface of the semiconductor substrate, covering the plurality of gate electrodes, and forming, at a surface of the interlayer insulating film, a plurality of first recessed parts respectively reflecting the recesses at the surfaces of the gate electrodes;

forming a plurality of contact holes penetrating the interlayer insulating film in a depth direction and reaching the semiconductor substrate by:
- a mask formation process of forming, at the surface of the interlayer insulating film, an etching mask having openings at parts corresponding to formation regions of the plurality of contact holes,
- a first groove formation process of forming a plurality of first grooves of a predetermined depth from the surface of the interlayer insulating film through an isotropic etching using the etching mask,
- a second groove formation process of forming a plurality of second grooves penetrating the interlayer insulating film in the depth direction respectively from surfaces of the plurality of first grooves through an anisotropic etching using the etching mask, and
- a removal process of removing the etching mask;

planarizing the interlayer insulating film through a heat treatment;

forming a first electrode film in ohmic contact with the semiconductor substrate in the plurality of contact holes;

forming a second electrode film containing titanium, on a surface of the first electrode film and the surface of the interlayer insulating film; and forming a third electrode film containing aluminum, on a surface of the second electrode film, wherein in the first groove formation process, the predetermined depth of the plurality of first grooves is in a range from 20% to 50% of a distance in the depth direction between the surface of the interlayer insulating film excluding the plurality of first recessed parts, to a top of the gate insulating film on the first main surface of the semiconductor substrate.

16. The method according to claim 15, wherein forming the interlayer insulating film includes sequentially depositing a first insulating layer and a second insulating layer, the second insulating layer having a boron concentration in a range from 1 wt % to 3 wt % and a phosphorus concentration in a range from 1 wt % to 3 wt %, respectively higher than those of the first insulating layer, in the first groove formation process, the plurality of first grooves is formed at the second insulating layer, in the second groove formation process, the plurality of second grooves are each formed penetrating the second insulating layer and the first insulating layer in the depth direction from a bottom of each of the plurality of first grooves, and the heat treatment for planarizing the interlayer insulating film is performed at a temperature that is at most 1000 degrees C.

17. The method according to claim 15, wherein forming the plurality of first recessed parts respectively reflecting the recesses at the surfaces of the gate electrodes includes forming
- at least three recessed parts separate from one another, and
- at least three protruding parts, each of which includes a vertex formed by one of the at least three recessed parts and a portion of the interlayer insulating film adjacent to said one recessed part, repeatedly at the surface of the interlayer insulating film, the at least three recesses including a first recessed part corresponding to one of the recesses at the surfaces of the gate electrodes.

* * * * *